United States Patent
Guha

(10) Patent No.: US 8,895,323 B2
(45) Date of Patent: Nov. 25, 2014

(54) METHOD OF FORMING A MAGNETORESISTIVE RANDOM-ACCESS MEMORY DEVICE

(71) Applicant: Lam Research Corporation, Fremont, CA (US)

(72) Inventor: Joydeep Guha, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/715,971

(22) Filed: Dec. 14, 2012

(65) Prior Publication Data

US 2013/0154037 A1    Jun. 20, 2013

Related U.S. Application Data

(60) Provisional application No. 61/577,377, filed on Dec. 19, 2011.

(51) Int. Cl.
*H01L 29/82* (2006.01)
*H01L 43/12* (2006.01)

(52) U.S. Cl.
CPC .............. *H01L 43/12* (2013.01); *H01L 29/82* (2013.01)
USPC .............. 438/3; 257/421; 257/422; 257/423; 257/424; 257/427; 365/171; 365/172; 365/173; 365/157; 365/158; 360/324.2; 360/326

(58) Field of Classification Search
CPC ....... H01L 43/08; H01L 27/22; H01L 43/065; G11C 11/16
USPC ........ 257/20, 414, 421–427, E29.323; 438/3; 365/157–158, 171–173; 360/324–326
See application file for complete search history.

(56) References Cited

U.S. PATENT DOCUMENTS

| | | | |
|---|---|---|---|
| 2003/0203509 A1* | 10/2003 | Rizzo et al. | 438/3 |
| 2005/0029564 A1 | 2/2005 | Mattson | |
| 2007/0020774 A1 | 1/2007 | Nejad | |
| 2008/0112214 A1 | 5/2008 | Chung | |
| 2008/0122047 A1 | 5/2008 | Honer | |
| 2010/0047929 A1 | 2/2010 | Hong | |
| 2010/0176368 A1* | 7/2010 | Ko et al. | 257/5 |
| 2011/0133165 A1* | 6/2011 | Bangsaruntip et al. | 257/24 |
| 2013/0026439 A1* | 1/2013 | Bae et al. | 257/4 |

OTHER PUBLICATIONS

International Search Report dated Apr. 16, 2013 from International Patent Application No. PCT/US2012/070394.
Written Opinion dated Apr. 16, 2013 from International Patent Application No. PCT/US2012/070394.

* cited by examiner

*Primary Examiner* — Jami M Valentine
(74) *Attorney, Agent, or Firm* — Beyer Law Group LLP

(57) ABSTRACT

A method for forming MRAM (magnetoresistive random access memory) devices is provided. A bottom electrode assembly is formed. A magnetic junction assembly is formed, comprising, depositing a magnetic junction assembly layer over the bottom electrode assembly, forming a patterned mask over the magnetic junction assembly layer, etching the magnetic junction assembly layer to form the magnetic junction assembly with gaps, gap filling the magnetic junction assembly, and planarizing the magnetic junction assembly. A top electrode assembly is formed.

15 Claims, 8 Drawing Sheets

METHOD OF FORMING A MAGNETORESISTIVE RANDOM-ACCESS MEMORY DEVICE

CROSS REFERENCE TO RELATED APPLICATIONS

This application claims priority under 35 U.S.C. §119(e) from U.S. Provisional Patent Application No. 61/577,377, filed on Dec. 19, 2011, entitled "Method of Making Working MRAM Device" which is hereby incorporated by reference for all purposes.

BACKGROUND OF THE INVENTION

The present invention relates to forming a semiconductor device. More specifically, the present invention relates to forming a magnetoresistive random-access memory (MRAM) device.

During semiconductor wafer processing, features may be etched through a metal containing layer. In the formation of magnetoresistive random-access memory (MRAM) a plurality of thin metal layers or films may be sequentially etched.

SUMMARY OF THE INVENTION

To achieve the foregoing and in accordance with the purpose of the present invention, a method for forming MRAM (magnetoresistive random access memory) devices is provided. A bottom electrode assembly is formed. A magnetic junction assembly is formed. A top electrode assembly is formed.

In another manifestation of the invention, a method for forming MRAM (magnetoresistive random access memory) devices is provided. A bottom electrode assembly is formed, comprising depositing a bottom electrode assembly layer over a substrate, forming a patterned mask over the bottom electrode assembly layer, etching the bottom electrode assembly layer to form the bottom electrode assembly with gaps, gap filling the gaps in the bottom electrode assembly, stripping the patterned mask over the bottom electrode assembly, and planarizing the bottom electrode assembly. A magnetic junction assembly is formed, comprising depositing a magnetic junction assembly layer over the planarized bottom electrode assembly, forming a patterned mask over the magnetic junction assembly layer, etching the magnetic junction assembly layer to form the magnetic junction assembly with gaps, gap filling the magnetic junction assembly, stripping the patterned mask over the magnetic junction assembly, and planarizing the magnetic junction assembly. A top electrode assembly is formed, comprising depositing a top electrode assembly layer over the planarized magnetic junction assembly, forming a patterned mask over the top electrode assembly layer, etching the top electrode assembly layer to form the top electrode assembly with gaps, and gap filling the top electrode assembly.

In another manifestation of the invention, a magnetoresistive random access memory device is provided. A bottom electrode assembly is formed. A magnetic junction assembly is formed. A top electrode assembly is formed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
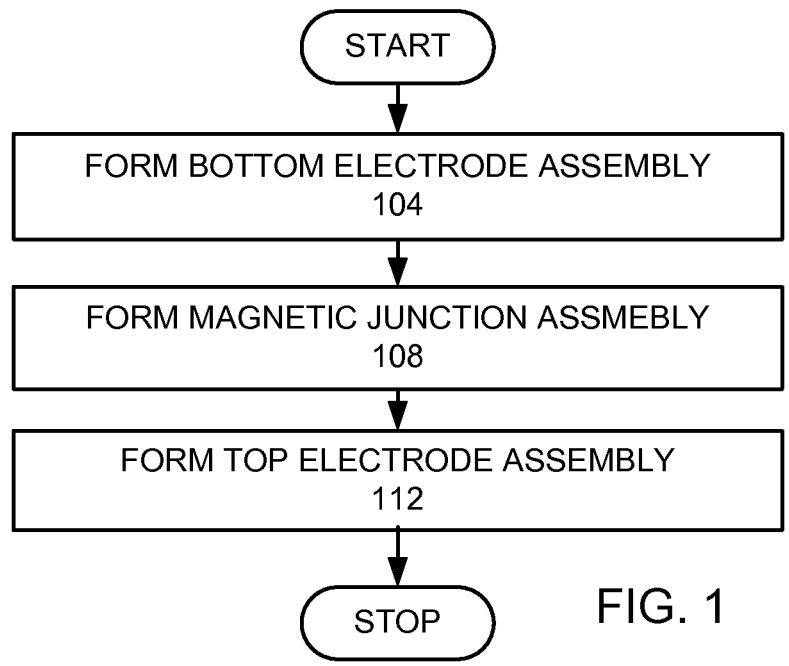
FIG. 1 is a high level flow chart of an embodiment of the invention.

To facilitate understanding, FIG. 1 is a high level flow chart of a process used in an embodiment. A bottom electrode assembly is formed over a substrate with a layer with contacts (step 104). A magnetic junction assembly is formed over the bottom electrode assembly (step 108). A top electrode assembly is formed over the magnetic junction assembly (step 112).

Embodiments

Figure 2A:
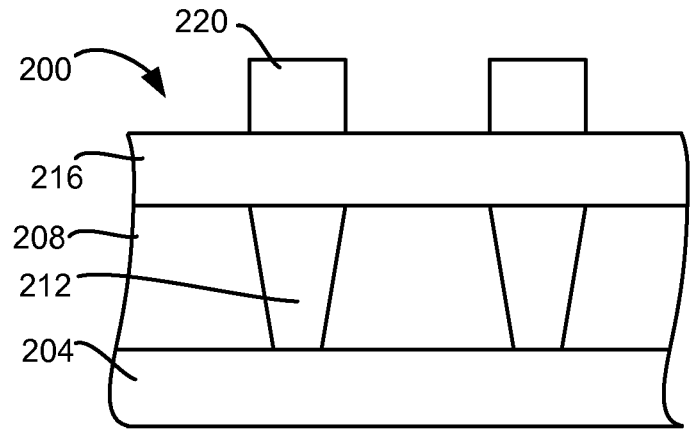
FIGS. 2A-K are schematic views of a stack processed according to an embodiment of the invention.
Figure 3:
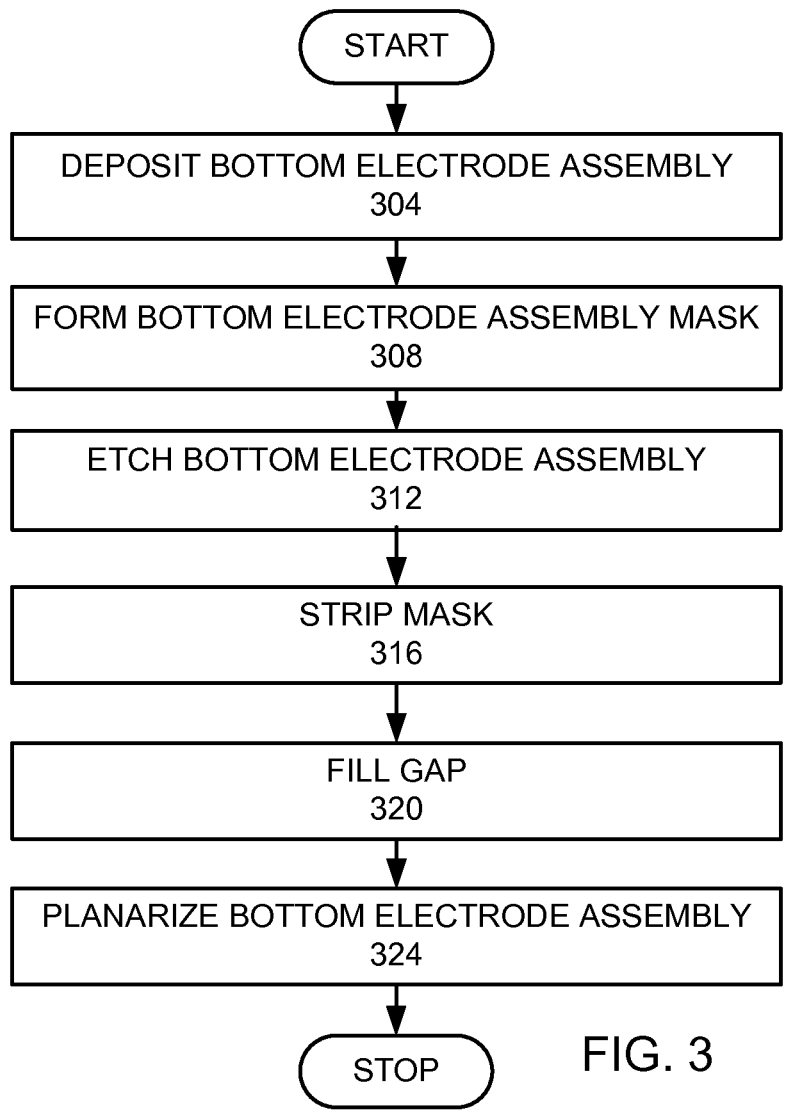
FIG. 3 is a more detailed flow chart of a step of forming a bottom electrode assembly.

In an embodiment, a bottom electrode assembly is formed (step 104). FIG. 2A is a cross-sectional view of a stack 200 with a substrate 204 over which a contact layer 208 with contacts 212 has been formed. One or more layers may be between the substrate 204 and the contact layer 208. FIG. 3 is a more detailed flow chart of the step of forming the bottom electrode assembly (step 104). A bottom electrode assembly layer 216 is deposited over the contact layer 208 (step 304). In this embodiment, the bottom electrode assembly layer 216 is a multiple layer of an adhesion layer over which an electrode layer is placed, over which a capping layer is placed. In an example of this embodiment, the bottom electrode assembly layer 216 is formed from layers of titanium nitride (TiN), tantalum (Ta), and ruthenium, (Ru).

A bottom electrode assembly mask 220 is formed over the bottom electrode assembly layer 216 (step 308). In one example, the bottom electrode assembly mask 220 is a carbon based lithographic material, such as photoresist. In another example, the bottom electrode assembly mask 220 is a metal or dielectric hardmask material formed in a multiple step process, such as forming a patterned photoresist mask over the hardmask layer and patterning the hardmask layer using the patterned photoresist mask.

Figure 2B:
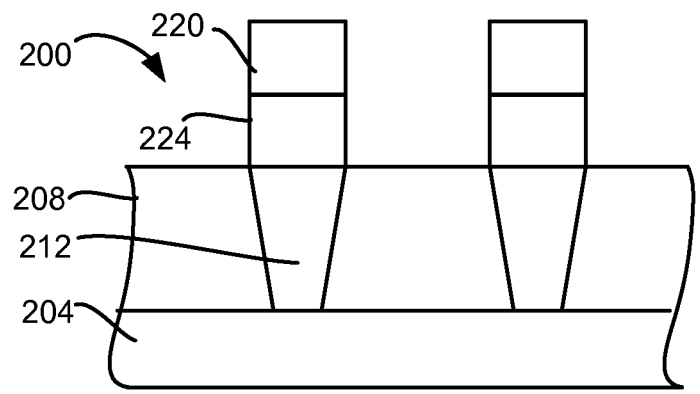
Figure 2C:
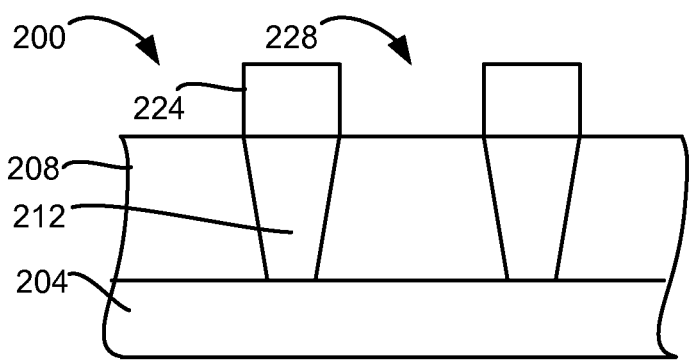

The bottom electrode assembly layer 216 is etched to form a bottom electrode assembly of bottom electrodes (step 312). FIG. 2B is a cross-sectional view of the stack 200 after the bottom electrode assembly layer 216 (FIG. 2A) has been etched to form the bottom electrodes 224 of the bottom electrode assembly. In various embodiments, a reactive ion etch or a wet etch may be used for etching the bottom electrode assembly layer 216. Preferably, the etching of the bottom electrode assembly layer 216 is performed by a dry etch, such as a reactive ion etch. The bottom electrode assembly mask 220 is stripped (step 316). In alternative embodiments of the invention, the bottom electrode assembly mask 220 is not stripped at this step, since the bottom electrode assembly mask 220 may be stripped during other steps. FIG. 2C is a cross-sectional view of the stack 200 after the bottom electrode assembly mask 220 (FIG. 2B) has been stripped. Gaps 228 are between the bottom electrodes 224 of the bottom electrode assembly. An optional clean step may be provided after the stripping or etching.

Figure 2D:
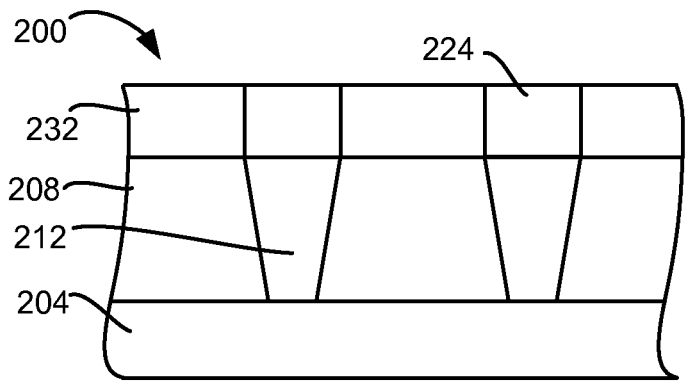

The gaps 228 are filled (step 320). Preferably, the gaps 228 are filled with a dielectric material. The dielectric material is planarized (step 324). FIG. 2D is a cross-sectional view of the stack 200 after the gaps 228 (FIG. 2C) have been filled with a dielectric filler 232, which has been planarized. In this example, the planarization is accomplished using chemical mechanical polishing (CMP). In embodiments where the bottom electrode assembly mask 220 is not stripped, the bottom electrode assembly mask 220 may be removed by the CMP.

Figure 2E:
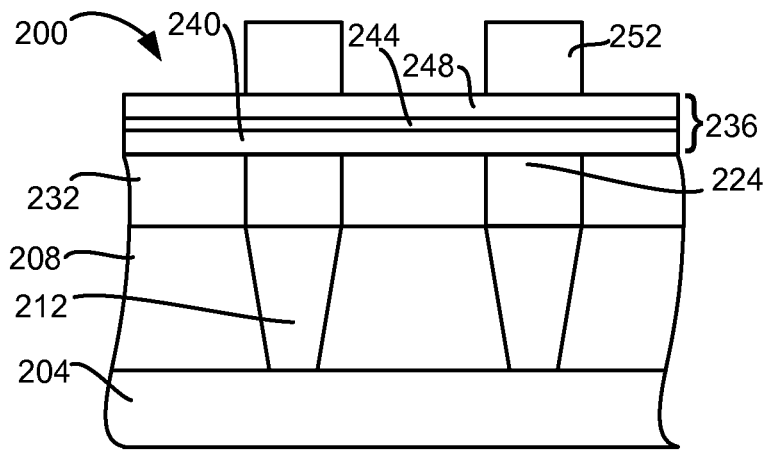
Figure 4:
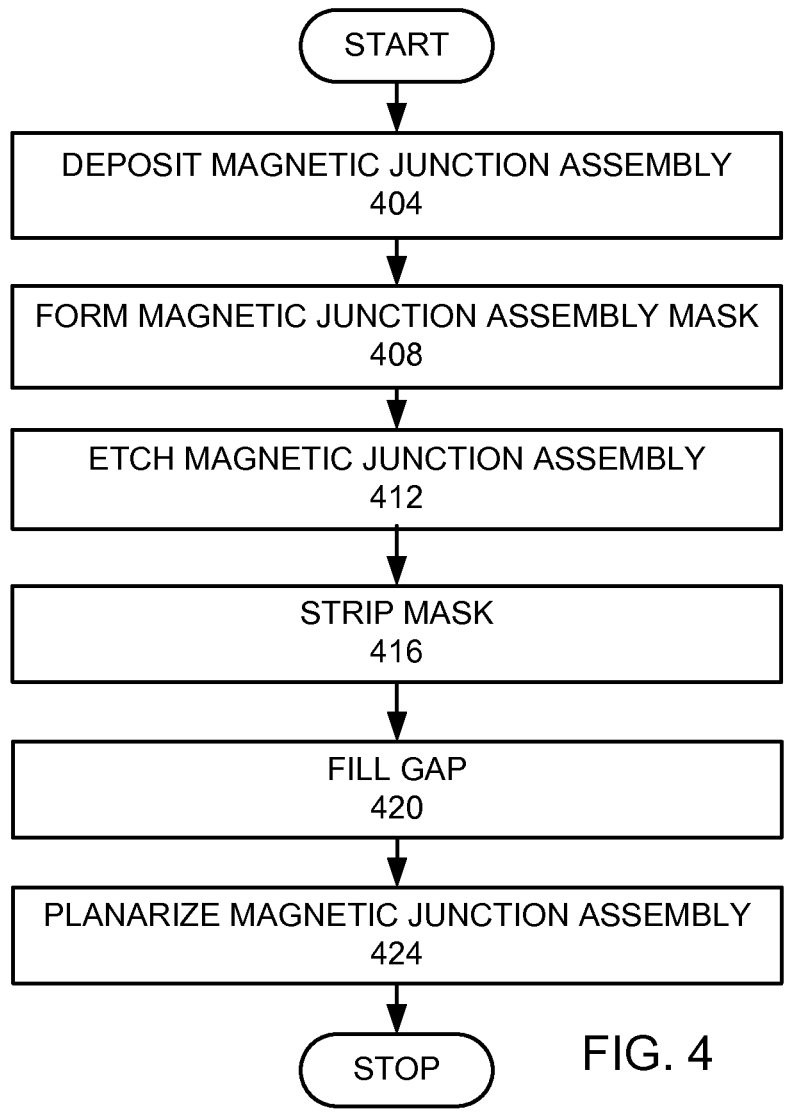
FIG. 4 is a more detailed flow chart of a step of forming a magnetic junction assembly.

The magnetic junction assembly is formed (step 108). FIG. 4 is a more detailed flow chart of the step of forming the magnetic junction assembly (step 108). A magnetic junction assembly layer is deposited over the bottom electrodes 224 and the dielectric filler 232 (step 404). FIG. 2E is a cross-sectional view of the stack 200 after the magnetic junction assembly layer 236 has been deposited. In this embodiment, the magnetic junction assembly layer 236 comprises a bottom magnetic layer 240, a tunnel oxide layer 244 over the bottom magnetic layer 240, and a top magnetic layer 248 over the tunnel oxide layer 244. In an embodiment, the bottom magnetic layer 240 and the top magnetic layer 248 are pinned magnets. In another embodiment, the bottom magnetic layer 240 is a pinned magnet and the top magnetic layer 248 is a free magnet layer and an anti ferromagnetic layer. Other embodiments may provide additional adhesion, capping, lattice matching, and work function matching layers.

A magnetic junction assembly mask 252 is formed over the magnetic junction assembly layer 236 (step 408). In one example, the magnetic junction assembly mask 252 is a carbon based lithographic material, such as photoresist. In another example, the magnetic junction assembly mask 252 is a metal or dielectric hardmask material formed in a multiple step process, such as forming a patterned photoresist mask over the hardmask layer and patterning the hardmask layer using the patterned photoresist mask.

Figure 2F:
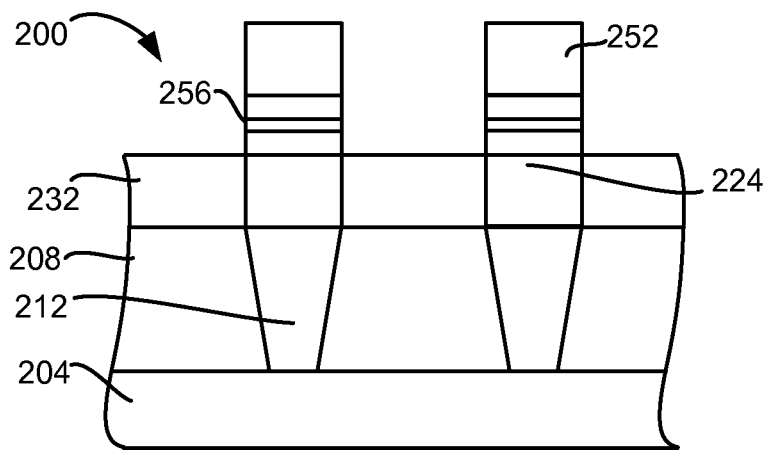
Figure 2G:
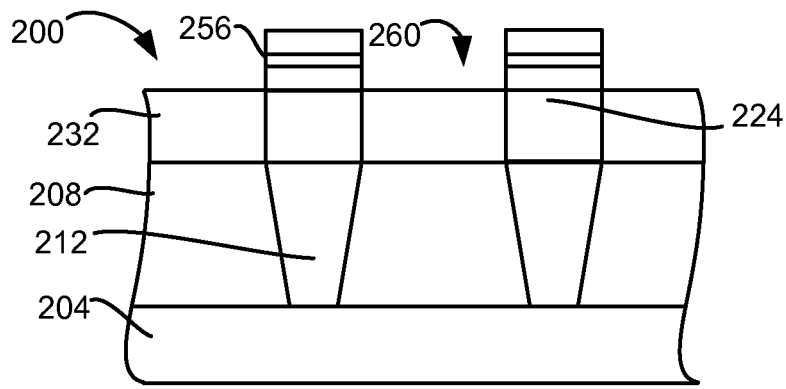

The magnetic junction assembly layer 236 is etched to form a magnetic junction assembly of magnetic junctions (step 412). FIG. 2F is a cross-sectional view of the stack 200 after the magnetic junction assembly layer has been etched to form the magnetic junctions 256 of the magnetic junction assembly. In various embodiments, a reactive ion etch or a wet etch may be used for etching the magnetic junction assembly layer. Preferably, the etch is non volatile, where all of the etch byproducts are non volatile. Preferably the etching of the magnetic junction assembly layer 236 is performed by a dry etch, such as a reactive ion etch. The magnetic junction assembly mask 252 is stripped (step 416). In alternative embodiments of the invention, the magnetic junction assembly mask 252 is not stripped at this step, since the magnetic junction assembly mask 252 may be stripped during other steps. FIG. 2G is a cross-sectional view of the stack 200 after the magnetic junction assembly mask has been stripped. Gaps 260 are between the magnetic junctions 256 of the magnetic junction assembly. An optional clean step may be provided after the stripping or etching.

Figure 2H:
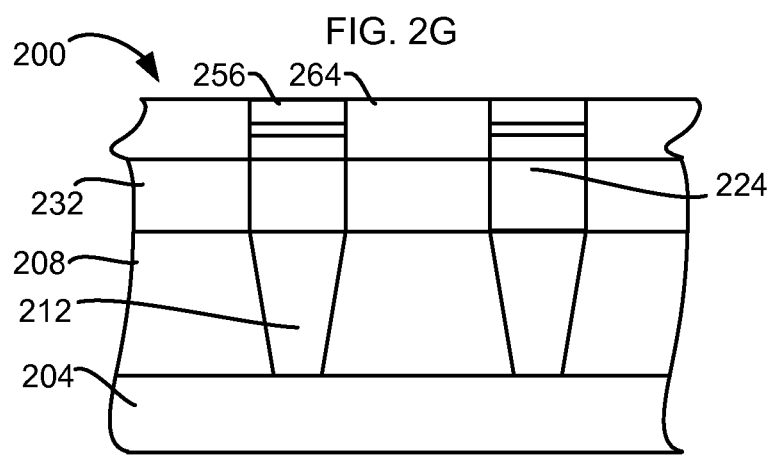

The gaps 260 are filled (step 420). Preferably, the gaps 260 are filled with a dielectric material. The dielectric material is planarized (step 424). FIG. 2H is a cross-sectional view of the stack 200 after the gaps have been filled with a dielectric filler 264, which has been planarized. In this example, the planarization is accomplished using chemical mechanical polishing (CMP). In embodiments where the magnetic junction assembly mask 252 is not stripped, the magnetic junction assembly mask 252 may be removed by the CMP.

Figure 5:
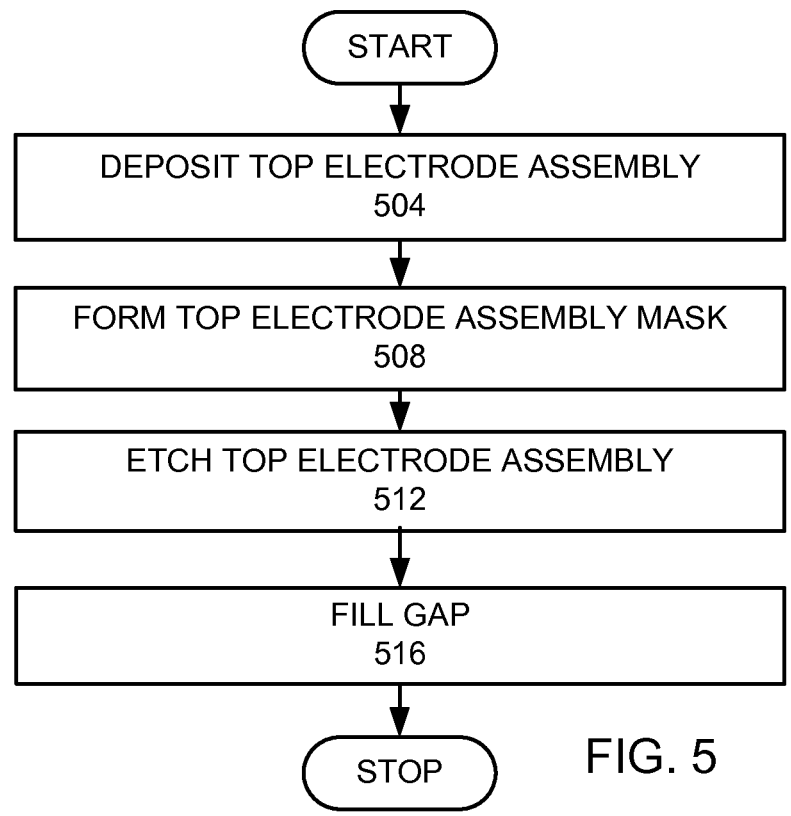
FIG. 5 is a more detailed flow chart of the step of forming a top electrode assembly.
Figure 2I:
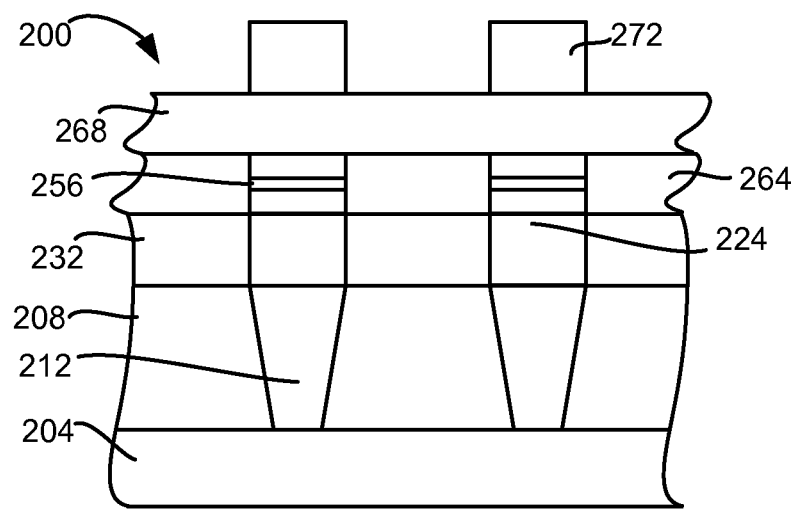

A top electrode assembly is formed (step 112). FIG. 5 is a more detailed flow chart of the step of forming the top electrode assembly (step 112). A top electrode assembly layer is deposited over the magnetic junctions 256 (step 504). FIG. 2I is a cross-sectional view of the stack 200 after the top electrode assembly layer 268 has been deposited over the magnetic junctions 256. In this embodiment, the top electrode assembly layer 268 is a multiple layer of an adhesion layer over which an electrode layer is placed, over which a capping layer is placed. In an example of this embodiment, the top electrode assembly layer 268 is formed from layers of tungsten (W), titanium nitride (TiN), and ruthenium (Ru), or tantalum (Ta), titanium nitride (TiN), and ruthenium, (Ru), or tungsten (W) and titanium nitride (TiN), or tantalum (Ta) and titanium nitride (TiN), or tantalum (Ta). Other embodiments may provide additional adhesion, capping, lattice matching, work function matching, and antiferromagnetic layers.

A top electrode assembly mask 272 is formed over the top electrode assembly layer 268 (step 508). In one example, the top electrode assembly mask 272 is a carbon based lithographic material, such as photoresist. In another example, the top electrode assembly mask 272 is a metal or dielectric hardmask material formed in a multiple step process, such as forming a patterned photoresist mask over the hardmask layer and patterning the hardmask layer using the patterned photoresist mask.

Figure 2J:
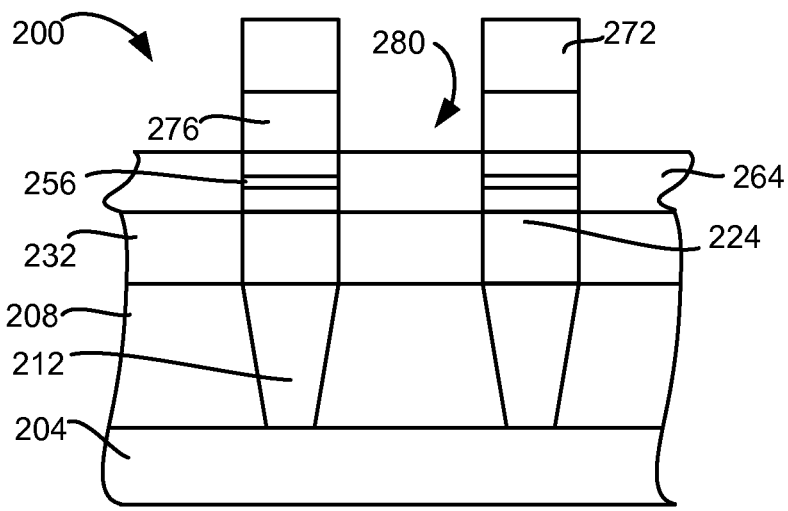

The top electrode assembly layer 268 is etched to form a top electrode assembly of top electrodes (step 512). FIG. 2J is a cross-sectional view of the stack 200 after the top electrode assembly layer 268 (FIG. 2I) has been etched to form the top electrodes 276 of the top electrode assembly with gaps 280 between the top electrodes 276. In various embodiments, a reactive ion etch or a wet etch may be used for etching the top electrode assembly layer 268. In an embodiment, the etch is a non volatile etch. Preferably the etching of the top electrode assembly layer 268 is performed by a dry etch, such as a reactive ion etch. An optional clean step may be provided after the etching.

Figure 2K:
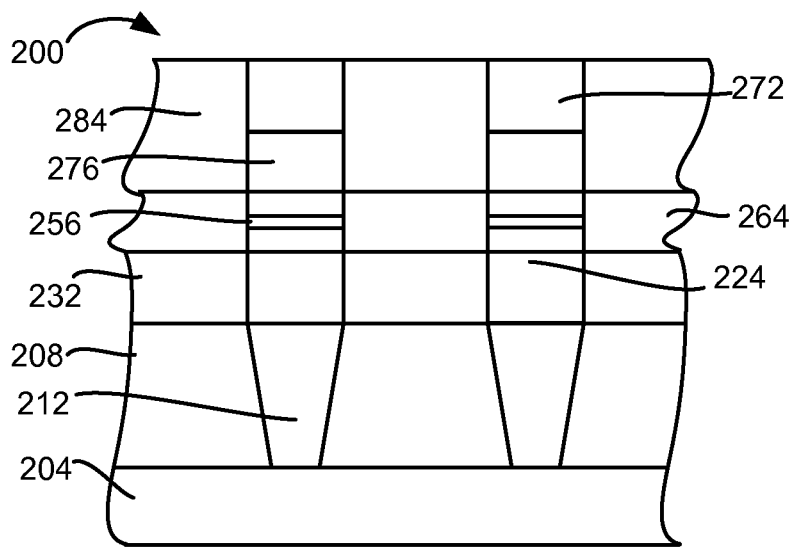

The gaps 280 are filled (step 516). Preferably, the gaps 280 are filled with a dielectric material. FIG. 2K is a cross-sectional view of the stack 200 after the gaps 280 (FIG. 2J) have been filled with a dielectric filler 284. In this embodiment, the top electrode assembly mask 272 is not stripped and the dielectric filler 284 is not planarized. The stripping of the top electrode assembly mask 272 and the planarization of the dielectric filler 284 may occur in subsequent steps. In other embodiments, the top electrode assembly mask 272 may be stripped before the deposition of the dielectric filler 284. In other embodiments, the planarization and the removal of the top electrode assembly mask 272 may be performed by a CMP process.

These embodiments minimize exposure of the sidewalls of the stack to sputtered metallic deposition. In addition, these embodiments minimize exposure of the sidewalls of the magnetic junctions 256 to sputtered metallic deposition.

Figure 6A:
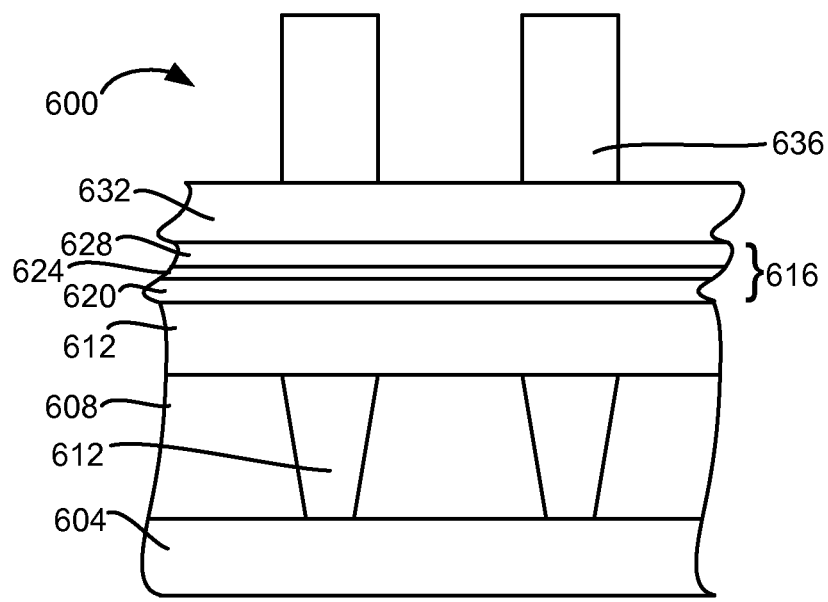
FIGS. 6A-B are schematic views of a stack processed according to the prior art.

FIG. 6A is a cross-sectional view of a stack 600 processed according to the prior art. In such a stack, over a substrate layer 604 a contact layer 608 with contacts 610 is formed. A lower electrode assembly layer 612 is formed over the contact layer 608 with contacts 610. A magnetic assembly layer 616 is formed over the lower electrode assembly layer 612. The magnetic assembly layer 616 comprises a bottom magnetic layer 620, a tunnel oxide layer 624, and a top magnetic layer 628. An upper electrode assembly layer 632 is formed over the magnetic assembly layer 616. A patterned mask 636 is formed over the upper electrode assembly layer 632.

Figure 6B:
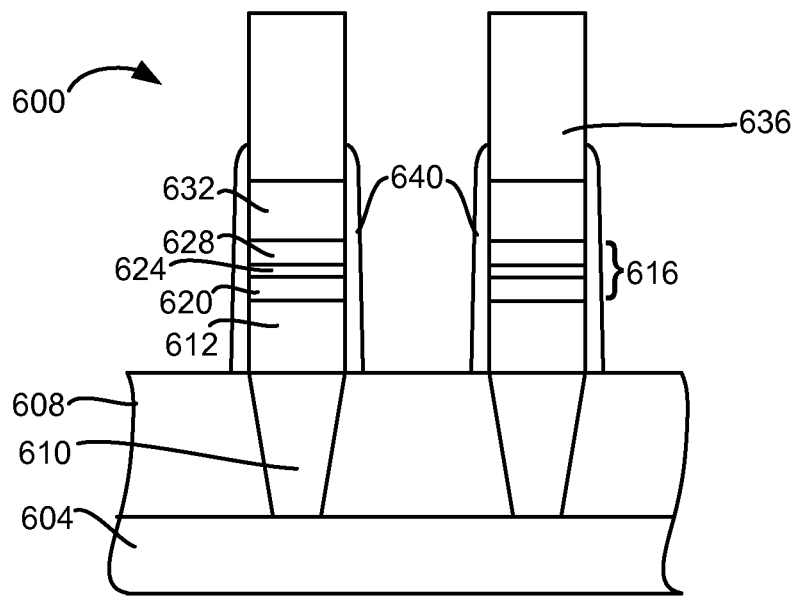

The patterned mask 636 is used to etch the upper electrode assembly layer 632, the magnetic assembly layer 616, and the lower electrode assembly layer 612. FIG. 6B is a cross-sectional view of the stack 600 after the upper electrode assembly layer 632, the magnetic assembly layer 616, and the lower electrode assembly layer 612 have been etched. The etching forms sidewalls 640 on sides of the stack 600. Due to the high aspect ratio of the etched spaces, removal of the sidewalls 640 is difficult. The sidewalls 640 may cause electrical shorts between different layers. In addition, sidewalls 640 formed from materials from the bottom magnetic layer 620 or top magnetic layer 628 may be magnetic, which would further interfere with the electrical operations of the stack 600. In addition, the tunnel oxide layer 624 is exposed to an etching plasma during the etching of the tunnel oxide layer 624, the bottom magnetic layer 620, and the lower electrode assembly layer 612.

By individually etching each layer and then filling the gaps before a subsequent etch, exposure of each layer to an etch plasma or sidewall deposition is minimized. Such metallic deposition may cause electrical shorts in the metallic junctions. If sputtered metallic deposition comes from the magnetic junctions, the resulting sidewalls may be magnetic, which may interfere with the functioning of the resulting devices. In addition, embodiments of the invention minimizes the exposure of the tunnel oxide to plasma, which reduces damage to the tunnel oxide. Such damage degrades device electrical behavior. Sidewalls on resulting high aspect ratio devices are difficult to clean. Therefore, the embodiments that reduce such sidewalls provide improved devices. Other embodiments may provide steps in other orders, as long as a gap fill is provided before a subsequent etch.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming MRAM (magnetoresistive random access memory) devices, comprising:
   forming a bottom electrode assembly;
   forming a magnetic junction assembly, wherein the forming the magnetic junction assembly comprises:
      depositing a magnetic junction assembly layer over the bottom electrode assembly, wherein the depositing the magnetic junction assembly layer comprises:
         depositing a bottom magnetic layer over the bottom electrode assembly;
         depositing a tunnel oxide layer over the bottom magnetic layer; and
         depositing a top magnetic layer over the tunnel oxide layer;
      forming a patterned mask over the magnetic junction assembly layer;
      etching the magnetic junction assembly layer to form the magnetic junction assembly with gaps;
      gap filling the magnetic junction assembly; and
      planarizing the magnetic junction assembly; and
   forming a top electrode assembly.

2. The method, as recited in claim 1, wherein the forming the bottom electrode assembly, comprises:
   depositing a bottom electrode assembly layer over a substrate;
   forming a patterned mask over the bottom electrode assembly layer;
   etching the bottom electrode assembly layer to form the bottom electrode assembly with gaps;
   gap filling the gaps in the bottom electrode assembly; and
   planarizing the bottom electrode assembly.

3. The method, as recited in claim 2, wherein the forming the top electrode assembly, comprises:
   depositing a top electrode assembly layer over the planarized magnetic junction assembly;
   forming a patterned mask over the top electrode assembly layer;
   etching the top electrode assembly layer to form the top electrode assembly with gaps; and
   gap filling the top electrode assembly.

4. The method, as recited in claim 3, further comprising:
   stripping the patterned mask over the bottom electrode assembly; and
   stripping the patterned mask over the magnetic junction assembly.

5. The method, as recited in claim 4, wherein the etching the bottom electrode assembly layer is performed by a dry etch.

6. The method, as recited in claim 5, wherein the etching the magnetic junction assembly layer is performed by a dry etch.

7. The method, as recited in claim 6, wherein the etching the top electrode assembly layer is performed by a dry etch.

8. The method, as recited in claim 7, wherein the gap filling fills the gaps with a dielectric material.

9. The method, as recited in claim 2, wherein the etching the bottom electrode assembly layer is performed by a dry etch.

10. The method, as recited in claim 1, wherein the etching the magnetic junction assembly layer is performed by a dry etch.

11. The method, as recited in claim 1, wherein the gap filling fills the gaps with a dielectric material.

12. The method, as recited in claim 1, wherein the forming the top electrode assembly, comprises:
   depositing a top electrode assembly layer over the magnetic junction assembly;
   forming a patterned mask over the top electrode assembly layer;
   etching the top electrode assembly layer to form the top electrode assembly with gaps; and
   gap filling the top electrode assembly.

13. The method, as recited in claim 11, wherein the etching the top electrode assembly layer is performed by a dry etch.

14. A method for forming MRAM (magnetoresistive random access memory) devices, comprising:
   forming a bottom electrode assembly, comprising:
      depositing a bottom electrode assembly layer over a substrate;
      forming a patterned mask over the bottom electrode assembly layer;
      etching the bottom electrode assembly layer to form the bottom electrode assembly with gaps;
      gap filling the gaps in the bottom electrode assembly;

stripping the patterned mask over the bottom electrode assembly; and
planarizing the bottom electrode assembly;
forming a magnetic junction assembly, comprising
depositing a magnetic junction assembly layer over the planarized bottom electrode assembly, wherein the depositing the magnetic junction assembly layer comprises:
depositing a bottom magnetic layer over the bottom electrode assembly;
depositing a tunnel oxide layer over the bottom magnetic layer; and
depositing a top magnetic layer over the tunnel oxide layer;
forming a patterned mask over the magnetic junction assembly layer;
etching the magnetic junction assembly layer to form the magnetic junction assembly with gaps;
gap filling the magnetic junction assembly;
stripping the patterned mask over the magnetic junction assembly; and
planarizing the magnetic junction assembly; and
forming a top electrode assembly, comprising
depositing a top electrode assembly layer over the planarized magnetic junction assembly;
forming a patterned mask over the top electrode assembly layer;
etching the top electrode assembly layer to form the top electrode assembly with gaps; and
gap filling the top electrode assembly.

15. A magnetoresistive random access memory device formed by the method, comprising:
forming a bottom electrode assembly;
forming a magnetic junction assembly, wherein the forming the magnetic junction assembly comprises:
depositing a magnetic junction assembly layer over the bottom electrode assembly, wherein the depositing the magnetic junction assembly layer comprises:
depositing a bottom magnetic layer over the bottom electrode assembly;
depositing a tunnel oxide layer over the bottom magnetic layer; and
depositing a top magnetic layer over the tunnel oxide layer;
forming a patterned mask over the magnetic junction assembly layer;
etching the magnetic junction assembly layer to form the magnetic junction assembly with gaps;
gap filling the magnetic junction assembly; and
planarizing the magnetic junction assembly; and
forming a top electrode assembly.

* * * * *